US012671323B2

(12) United States Patent
Song

(10) Patent No.: US 12,671,323 B2
(45) Date of Patent: Jun. 30, 2026

(54) POWER CONVERSION APPARATUS

(71) Applicant: LS ELECTRIC CO., LTD., Anyang-si (KR)

(72) Inventor: Bo Sun Song, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 224 days.

(21) Appl. No.: 18/726,262

(22) PCT Filed: Jan. 2, 2023

(86) PCT No.: PCT/KR2023/000037
§ 371 (c)(1),
(2) Date: Jul. 2, 2024

(87) PCT Pub. No.: WO2023/132586
PCT Pub. Date: Jul. 13, 2023

(65) Prior Publication Data
US 2025/0070654 A1       Feb. 27, 2025

(30) Foreign Application Priority Data

Jan. 6, 2022    (KR) ........................ 10-2022-0002118

(51) Int. Cl.
*H05K 7/20*        (2006.01)
*H02M 3/00*        (2006.01)
(Continued)

(52) U.S. Cl.
CPC ........ *H02M 3/003* (2021.05); *H05K 7/14329* (2022.08); *H05K 7/20145* (2013.01);
(Continued)

(58) Field of Classification Search
CPC .. H05K 7/14329; H05K 7/20; H05K 7/20127; H05K 7/20136; H05K 7/20145;
(Continued)

(56) References Cited

U.S. PATENT DOCUMENTS

2007/0247811 A1*   10/2007   Ohmi ................. H05K 7/20909
                                                          361/697
2010/0202109 A1     8/2010   Zheng et al.
                              (Continued)

FOREIGN PATENT DOCUMENTS

JP          H0686567 A        3/1994
JP          H0847268 A        2/1996
                              (Continued)

OTHER PUBLICATIONS

Office Action for related Japanese Application No. 2024-538039; action dated May 20, 2025; (5 pages).
(Continued)

*Primary Examiner* — Thienvu V Tran
*Assistant Examiner* — Shahzeb K Ahmad
(74) *Attorney, Agent, or Firm* — K&L Gates LLP

(57)                    ABSTRACT

Disclosed is a power conversion apparatus. The power conversion apparatus according to one aspect of the present disclosure may include: a housing comprising an upper part, a lower part disposed in parallel with the upper part, a first side part connecting the upper part and the lower part, and a second side part disposed in parallel with the first side part; a transistor provided below the upper part inside the housing; a heat sink provided below the transistor and providing a passage through which air introduced from the outside moves; a first air blocking unit provided on a side surface of the heat sink and disposed in parallel with the first side part; a plurality of capacitors disposed between the first air blocking unit and the second side part; and a transformer disposed to be spaced apart from the heat sink, wherein the upper part may be provided with a discharge part formed above the transformer such that air that has passed through the passage is discharged to the outside of the housing.

7 Claims, 9 Drawing Sheets

100

(51) Int. Cl.
  H05K 7/14          (2006.01)
  H02M 7/00          (2006.01)
(52) U.S. Cl.
  CPC ..... H05K 7/20509 (2013.01); H05K 7/20909
       (2013.01); H05K 7/20918 (2013.01); H02M
                                  7/003 (2013.01)
(58) Field of Classification Search
  CPC ........... H05K 7/20154; H05K 7/20509; H05K
       7/209; H05K 7/20909; H05K 7/20918;
       H02M 3/003; H02M 3/28; H02M 7/003;
                                    H02M 7/28
  See application file for complete search history.

(56)                References Cited

U.S. PATENT DOCUMENTS

| | | | |
|---|---|---|---|
| 2010/0321889 A1* | 12/2010 | Yoshino .............. | H05K 7/20927 361/702 |
| 2012/0020021 A1* | 1/2012 | Kishimoto ............ | H02M 7/003 361/695 |
| 2013/0027887 A1* | 1/2013 | Osato ................. | H05K 7/20909 361/709 |
| 2020/0120830 A1 | 4/2020 | Song | |
| 2023/0114888 A1* | 4/2023 | Morisawa .......... | H05K 7/20145 361/695 |
| 2023/0276603 A1* | 8/2023 | An ..................... | H05K 7/20909 |

FOREIGN PATENT DOCUMENTS

| | | | | | |
|---|---|---|---|---|---|
| JP | 08228071 | A | | 9/1996 | |
| JP | 2005078355 | A | | 3/2002 | |
| JP | 2004187462 | A | | 7/2004 | |
| JP | 2007028785 | A | | 2/2007 | |
| JP | 201229372 | A | | 2/2012 | |
| JP | 2012029372 | A | * | 2/2012 | ........... H02M 5/271 |
| JP | 2012228019 | A | | 11/2012 | |
| JP | 2016220416 | A | | 12/2016 | |
| JP | 2017131103 | A | | 7/2017 | |
| JP | 2018198508 | A | | 12/2018 | |
| KR | 20010089402 | A | | 10/2001 | |
| KR | 20120072945 | A | | 7/2012 | |
| KR | 20180070270 | A | * | 6/2018 | ........ H05K 7/20409 |
| KR | 20190092012 | A | | 8/2019 | |
| KR | 20200092681 | A | | 8/2020 | |

OTHER PUBLICATIONS

International Search Report for related International Application No. PCT/KR2023/000037; action dated Jul. 13, 2023; (2 pages).
Written Opinion for related International Application No. PCT/KR2023/000037; action dated Jul. 13, 2023; (4 pages).

* cited by examiner

FIG. 1

POWER CONVERSION APPARATUS

CROSS-REFERENCE TO RELATED APPLICATIONS

This application is the National Stage filing under 35 U.S.C. 371 of International Application No. PCT/KR2023/000037, filed on Jan. 2, 2023, which claims the benefit of earlier filing date and right of priority to Korean Application No. 10-2022-0002118, filed on Jan. 6, 2022, the contents of which are all hereby incorporated by reference herein in their entirety.

FIELD

The present invention relates to a power conversion apparatus, and more particularly, to a power conversion apparatus having improved heat dissipation efficiency to prevent damage by heat.

BACKGROUND

In general, an uninterruptible power supply (UPS) is a device that prevents power abnormalities due to voltage fluctuations, frequency fluctuations, instantaneous power outages, transient voltages, etc. and supplies stable power when using general power or spare power. Such an uninterruptible power supply is connected between a battery and a mechanical or electronic device installed in a factory to secure the stable operation of the mechanical or electronic device. In addition, recently, as stability of operation of electronic devices used in finance, broadcasting, etc. is required, the introduction of the uninterruptible power supply is spreading.

The uninterruptible power supply is equipped with a power conversion apparatus that converts direct current (DC) power into power suitable for application to other loads. One of the power conversion apparatuses is a DC-to-DC converter that converts DC power into another DC power.

In such a power conversion apparatus, there is a problem that heat is excessively generated in a transformer that converts DC power into other power, and thus, the power conversion apparatus is damaged or its function is deteriorated by the heat.

SUMMARY

The present invention is to solve the above problems, and an object of the present invention is to provide a power conversion apparatus having improved heat dissipation efficiency to prevent damage by heat.

Another object of the present invention is to provide a power conversion apparatus with improved convenience when installing or replacing the power conversion apparatus.

The objects of the present invention are not limited to the above-mentioned objects, and other objects not mentioned will be clearly understood by those skilled in the art from the following description.

A power conversion apparatus according to one aspect of the present invention may include: a housing comprising an upper part, a lower part disposed in parallel with the upper part, a first side part connecting the upper part and the lower part, and a second side part disposed in parallel with the first side part: a transistor provided below the upper part inside the housing: a heat sink provided below the transistor and providing a passage through which air introduced from the outside moves: a first air blocking unit provided on a side surface of the heat sink and disposed in parallel with the first side part: a plurality of capacitors disposed between the first air blocking unit and the second side part; and a transformer disposed to be spaced apart from the heat sink, wherein the upper part may be provided with a discharge part formed above the transformer such that air that has passed through the passage is discharged to the outside of the housing.

In this case, the power conversion apparatus may further include a second air blocking unit disposed between the plurality of capacitors and the transformer.

The first air blocking unit may be disposed between the heat sink and the capacitor.

The heat sink may include: a heat dissipation plate supporting the transistor; and a plurality of heat dissipation fins extending downward from the plate and spaced apart from each other in parallel with the first side part.

The transistors may be disposed in parallel with the plurality of heat dissipation fins.

The power conversion apparatus may further include a support plate disposed between the lower part and the heat sink and supporting the heat sink, wherein the support plate may include an air guide formed to be inclined on one side of the support plate, wherein the air guide may guide air introduced from the outside to be supplied below one side of the heat sink.

The power conversion apparatus may further include: a substrate electrically connected to the transistor and the plurality of capacitors: a bus bar having one end electrically connected to the substrate and the other end protruding to the rear of the housing; and a coupling part coupled to the other end of the bus bar and detachably coupled to a connector of an uninterruptible power supply.

According to the above configuration, in the power conversion apparatus according to an embodiment of the present invention, air flowing into the heat sink is guided above the transformer, so that heat from the transformer does not flow into the transistor and the transistor is prevented from being damaged by heat.

In addition, since the coupling part is detachably coupled to the connector of the uninterruptible power supply, the convenience of installing or replacing the power conversion apparatus is improved.

BRIEF DESCRIPTION OF THE DRAWINGS

FIG. 1 is a perspective view showing the inside of an uninterruptible power supply according to an embodiment of the present invention.

3

Figure 7:
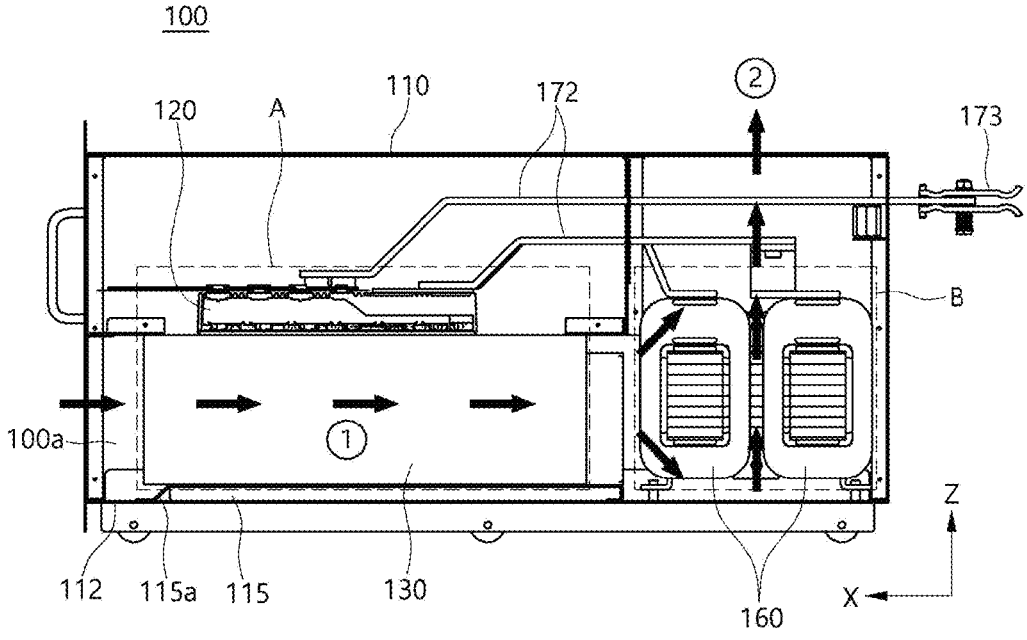

FIG. 7 is a diagram schematically illustrating air flow in a power conversion apparatus according to an embodiment of the present invention.

Figure 8:
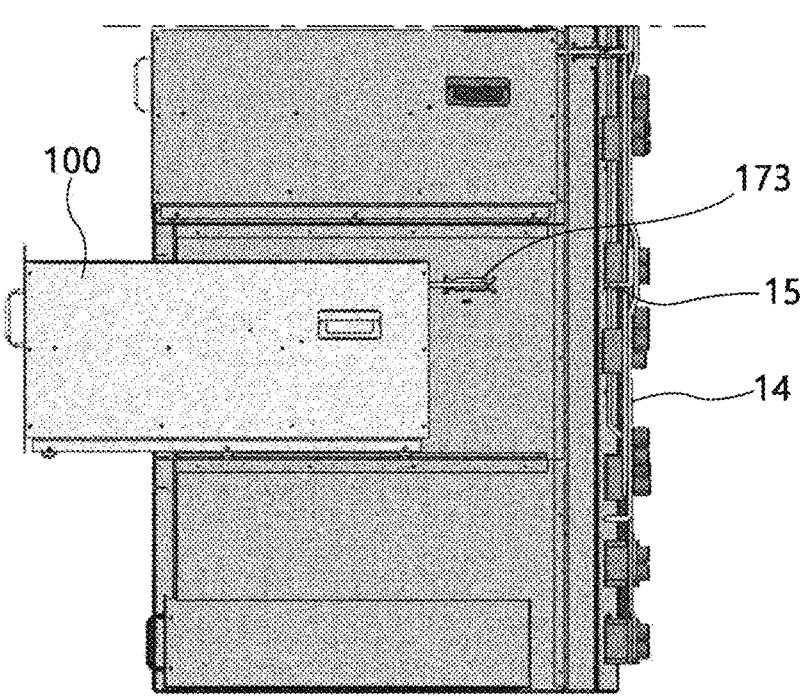

FIG. 8 is a diagram showing a state before a power conversion apparatus according to an embodiment of the present invention is connected to an uninterruptible power supply.

Figure 9:
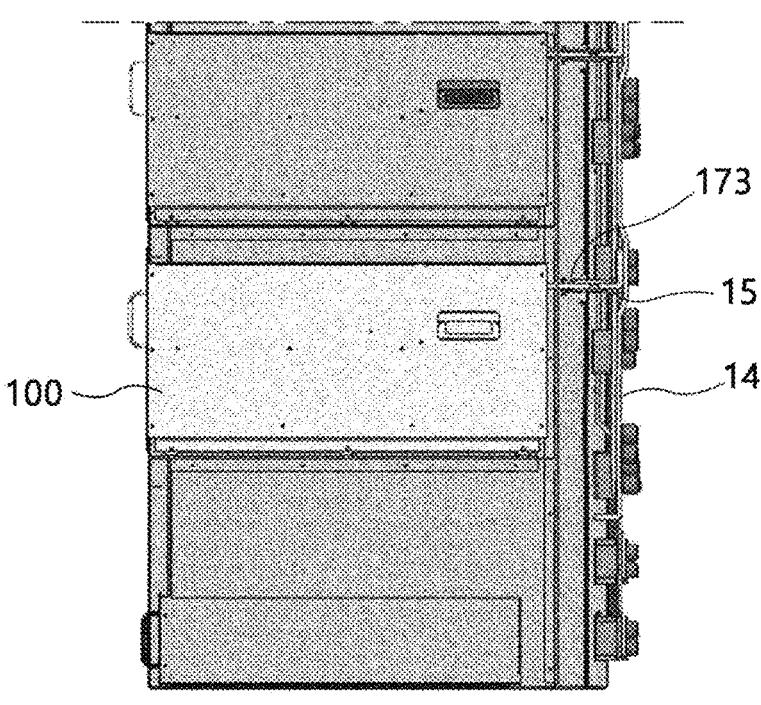

FIG. 9 is a diagram illustrating a state in which a power conversion apparatus according to an embodiment of the present invention is connected to an uninterruptible power supply.

| | |
|---|---|
| 100: power conversion apparatus | 110: housing |
| 111: upper part | 112: lower part |
| 113: first side part | 114: second side part |
| 120: transistor | 130: heat sink |
| 141: first air blocking unit | 150: a plurality of capacitors |
| 160: transformer | |

DETAILED DESCRIPTION

Hereinafter, with reference to the accompanying drawings, embodiments of the present invention will be described in detail so as to be easily implemented by one of ordinary skill in the art to which the present invention pertains. The present invention may be embodied in a variety of forms and is not limited to the embodiments described herein. In order to clearly describe the present invention, parts irrelevant to the description are omitted from the drawings; and throughout the specification, same or similar components are referred to as like reference numerals.

The words and terms used in the specification and claims of the present application are not to be construed as being limited to their ordinary or dictionary meanings, but should be interpreted as meanings and concepts consistent with the technical spirit of the present invention, based on the principle that the inventor may define terms and concepts to best describe his invention.

Therefore, the embodiments described in the specification and the configuration shown in the drawings correspond to preferred embodiments of the present invention, and do not represent the entire technical ideas of the present invention, so the configurations may have various equivalents and variations to replace them at the time of filing the present invention.

In the specification, terms such as "comprise" or "have" are intended to explain that a feature, number, step, operation, component, part or combination thereof described in the specification is present, but should not be construed to preclude the possibility of the presence or addition of one or more other features, numbers, steps, operations, components, parts or combinations thereof.

When a component is said to be "before", "after", "above" or "below" another component, it includes a case in which the component is placed "before", "after", "above" or "below" another component so as to be in direct contact with each other, as well as a case where any additional component is disposed between the two components, unless there are special circumstances. In addition, when a component is said to be "connected" to another component, it includes cases where they are not only directly connected to each other but also indirectly connected to each other, unless there are special circumstances.

Hereinafter, a power conversion apparatus according to an embodiment of the present invention will be described with reference to the drawings.

Figure 1:
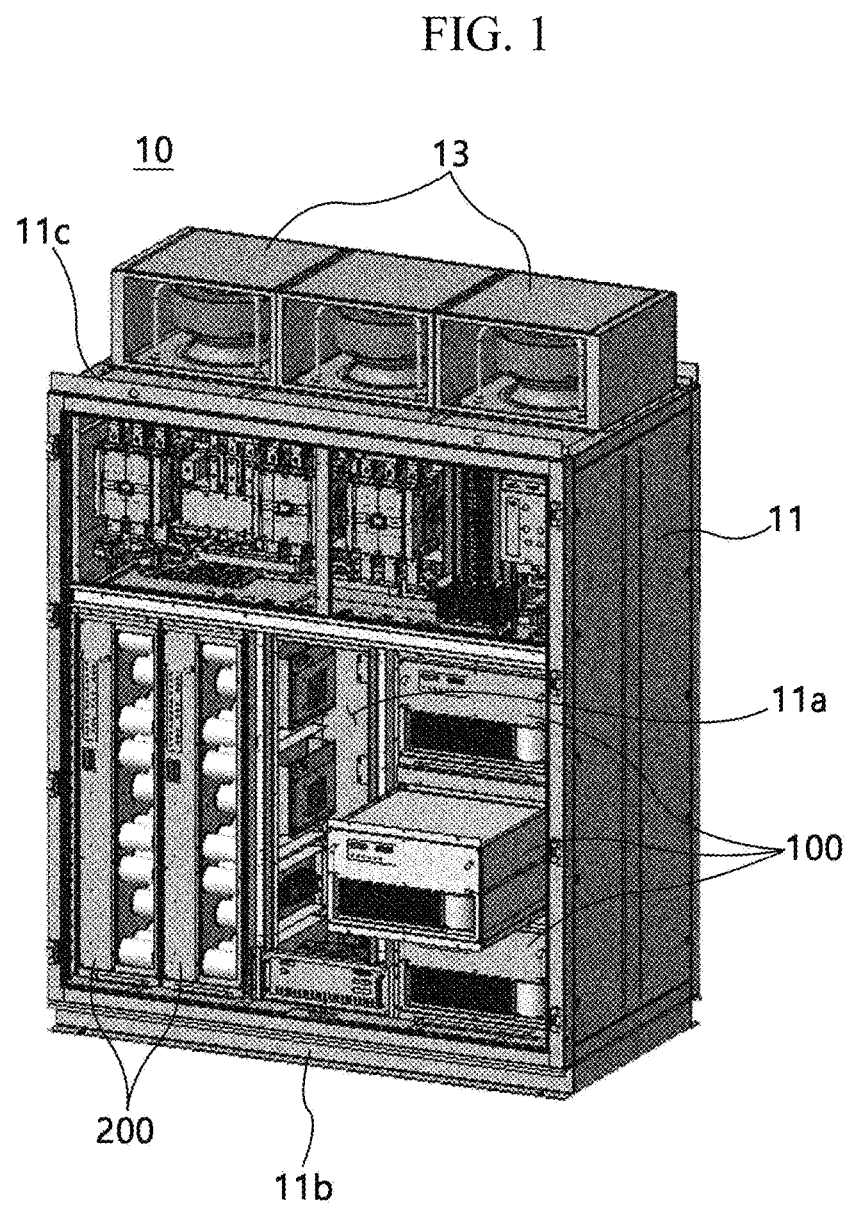

FIG. 1 is a perspective view showing the inside of an uninterruptible power supply according to an embodiment of the present invention.

Referring to FIG. 1, the uninterruptible power supply 10 according to an embodiment of the present invention includes a case 11 and power conversion apparatuses 100 and 200.

The case 11 is provided with an accommodation space 11a in which the power conversion apparatuses 100 and 200 and power devices are accommodated. The case 11 is made of a metal material. However, the case 11 is not limited to being made of a metal material, and may be made of various materials such as plastic having rigidity.

The power conversion apparatuses 100 and 200 include a first power conversion apparatus 100 and a second power conversion apparatus 200.

The first power conversion apparatus 100 is disposed in parallel with the lower surface 11b of the case 11. The first power conversion apparatus 100 is a direct current-to-direct current converter that converts direct current (DC) power into another direct current (DC) power. However, the first power conversion apparatus 100 is not limited to the DC-DC converter, and may be an AC-DC converter that converts alternating current (AC) power to DC power or a DC-AC converter that converts DC power to AC power. In this case, the first power conversion apparatus 100 is configured in plural, and the plurality of first power conversion apparatuses 100 are disposed to be stacked on each other. The first power conversion apparatus 100 will be described in detail later with reference to the drawings.

The second power conversion apparatus 200 is disposed in a direction perpendicular to the lower surface 11b of the case 11. The second power conversion apparatus 200 is an AC-DC converter that converts alternating current (AC) power into direct current (DC). However, the second power conversion apparatus 200 is not limited to the AC-DC converter, and may be an DC-DC converter that converts direct current (DC) power to DC power or a DC-AC converter that converts DC power to AC power. In this case, the second power conversion apparatus 200 is configured in plural, and the plurality of second power conversion apparatuses 100 are disposed in parallel with each other. Accordingly, the plurality of second power conversion apparatuses 200 are prevented from applying load to each other.

In addition, a fan 13 for discharging air from the accommodation space 11a of the case 11 to the outside is provided on the upper surface 11c of the case 11. The fan 13 rotates to suck air from the accommodation space 11a, and the air in the accommodation space 11a is discharged to the outside through the fan 13. Accordingly, since heat generated by the power conversion apparatuses 100 and 200 and the power device is discharged to the outside along the flow of air in the accommodation space 11a, the power conversion apparatuses 100 and 200 are prevented from being damaged by heat.

Figure 2:
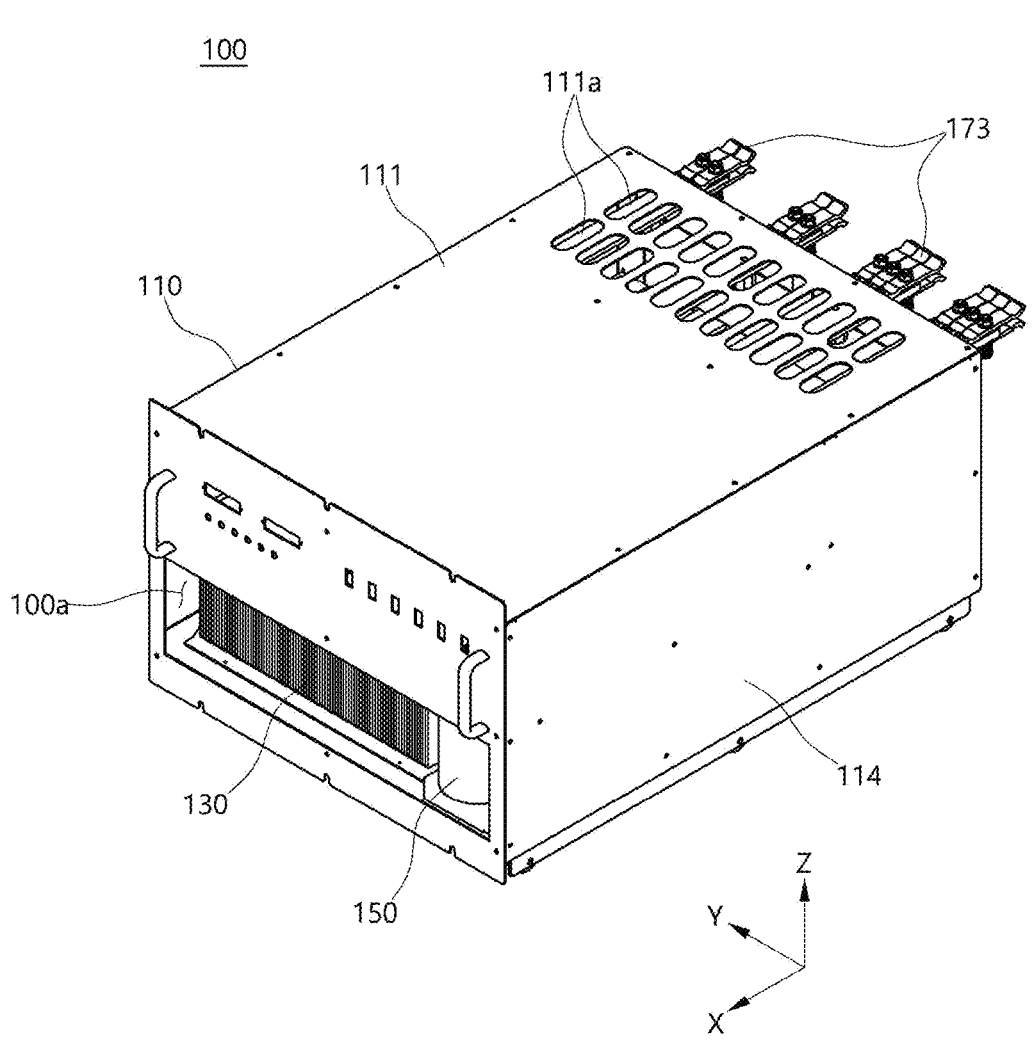
FIG. 2 is a perspective view showing an external appearance of a power conversion apparatus according to an embodiment of the present invention.
Figure 3:
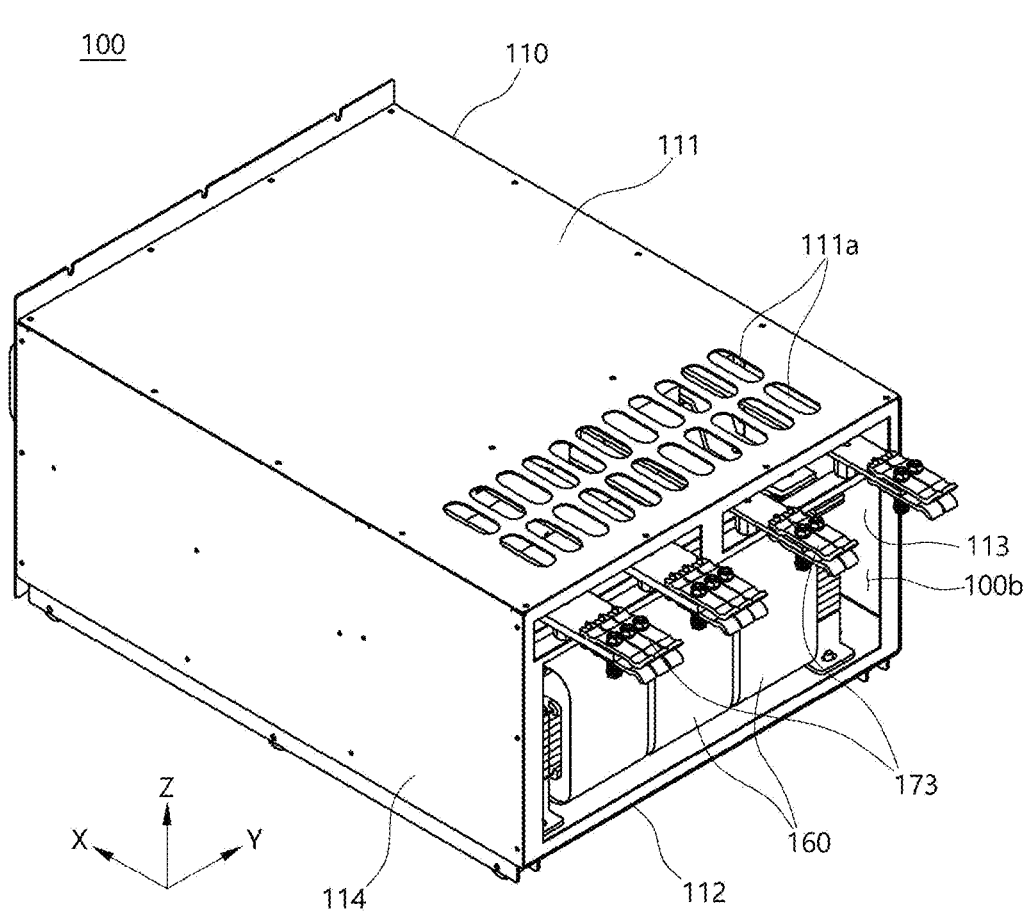
FIG. 3 is a perspective view of an external appearance of a power conversion apparatus according to an embodiment of the present invention as viewed from another side.
Figure 4:
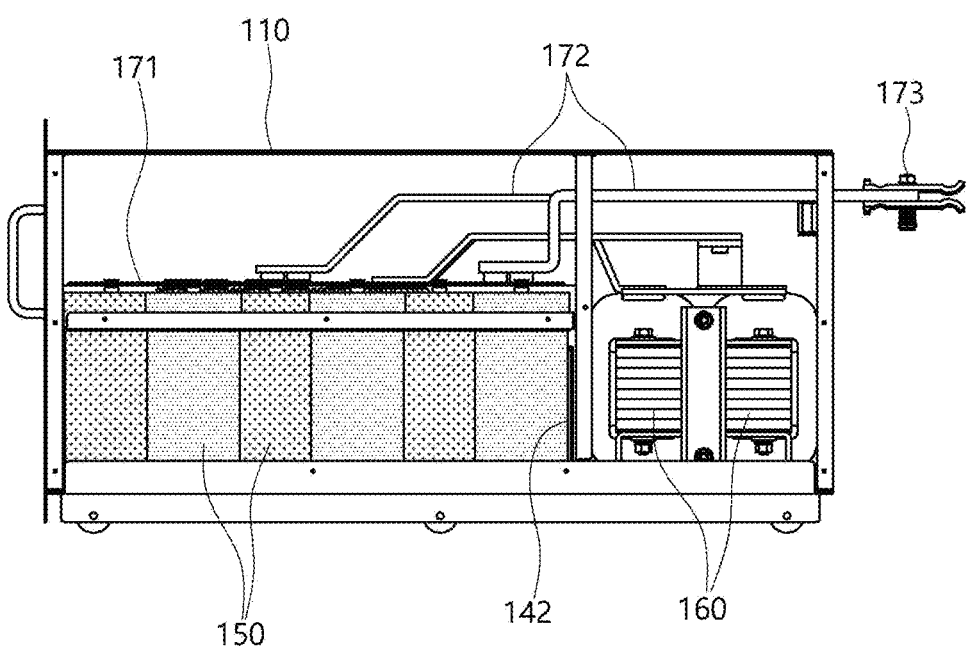
FIG. 4 is a side view illustrating the inside of a power conversion apparatus according to an embodiment of the present invention.
Figure 5:
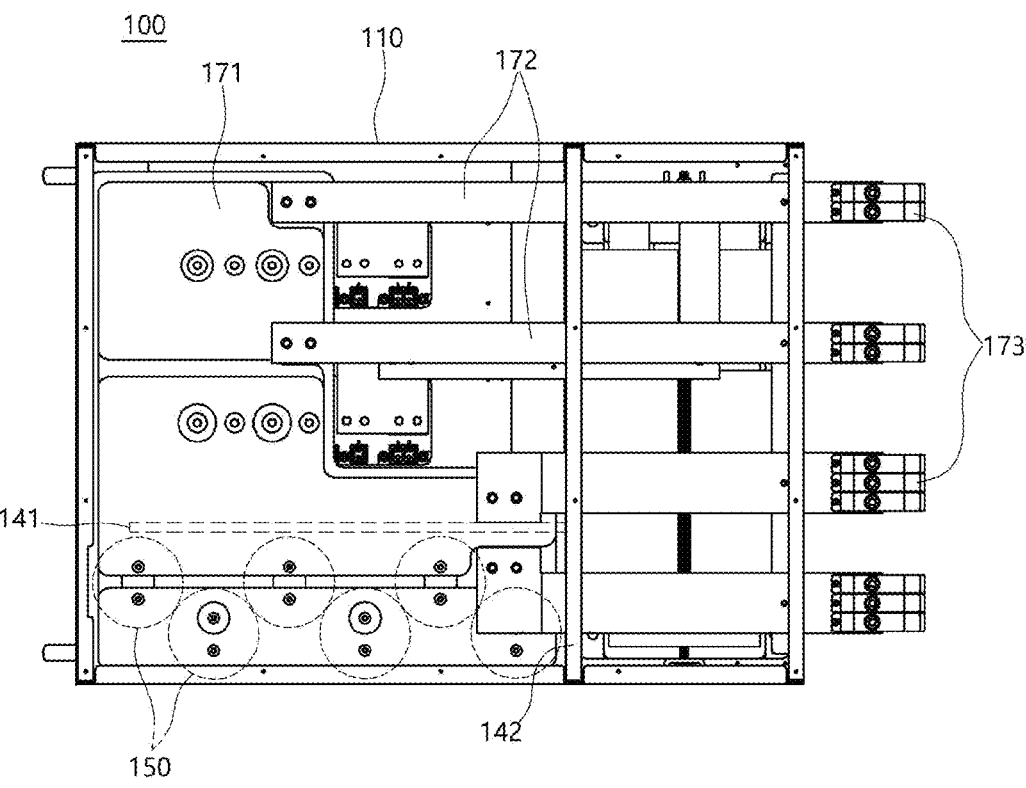
FIG. 5 is a plan view illustrating the inside of a power conversion apparatus according to an embodiment of the present invention.
Figure 6:
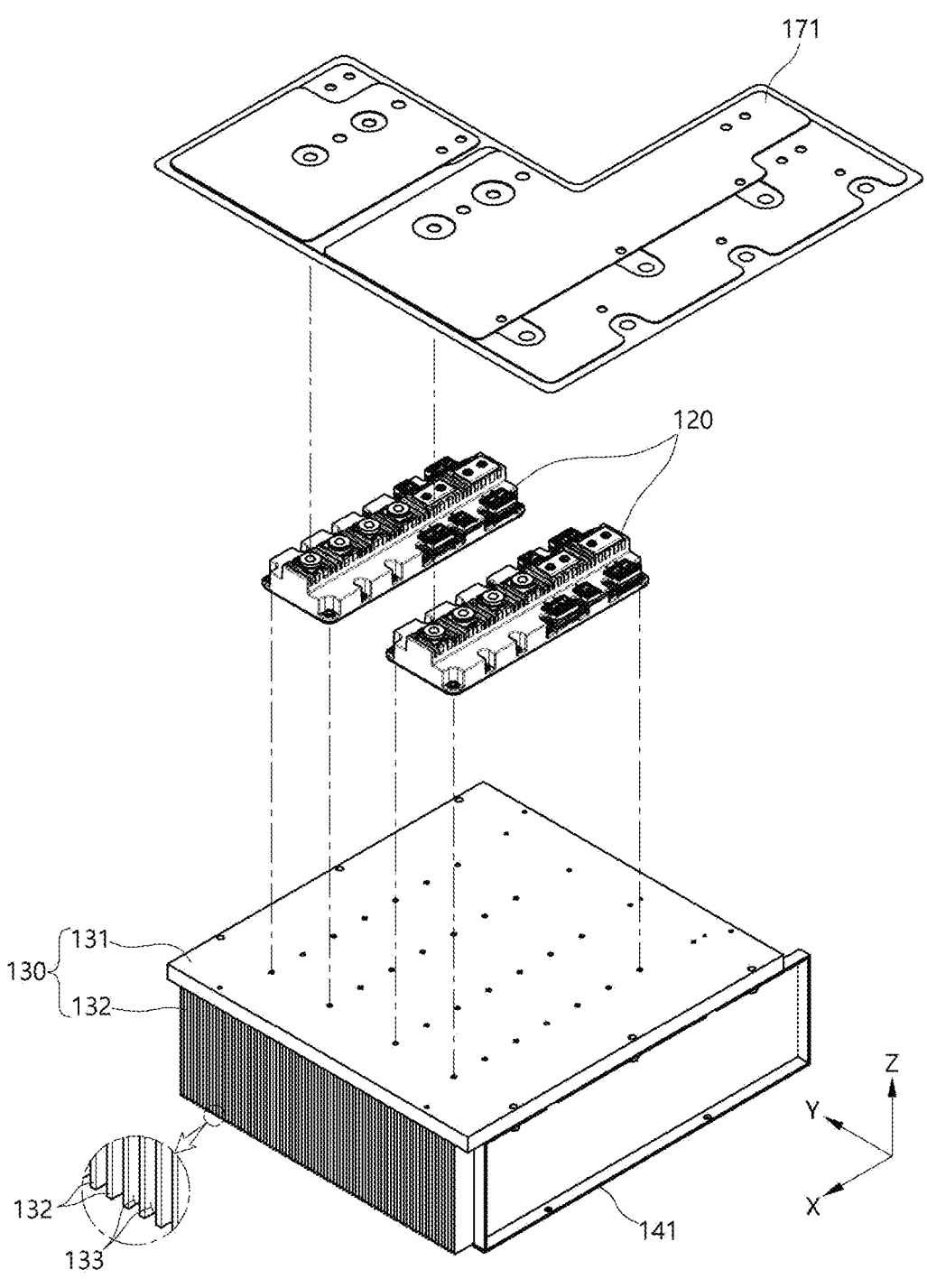
FIG. 6 is an exploded perspective view illustrating a state in which a heat sink, a transistor, and a substrate of a power conversion apparatus according to an embodiment of the present invention are separated.

FIG. 2 is a perspective view showing an external appearance of a power conversion apparatus according to an embodiment of the present invention, FIG. 3 is a perspective view of an external appearance of a power conversion apparatus according to an embodiment of the present invention as viewed from another side, FIG. 4 is a side view illustrating the inside of a power conversion apparatus according to an embodiment of the present invention, FIG. 5 is a plan view illustrating the inside of a power conversion apparatus according to an embodiment of the present invention, and FIG. 6 is an exploded perspective view illustrating a state in which a heat sink, a transistor, and a substrate of a power conversion apparatus according to an embodiment of the present invention are separated.

Referring to FIGS. 2 to 6, the power conversion apparatus 100 according to an embodiment of the present invention includes a housing 110, a transistor 120, a heat sink 130, a first air blocking unit 141, a plurality of capacitors 150, and a transformer 160.

The housing 110 has an approximately hexahedral shape. Further, the housing 110 is made of a metal material. However, the housing 110 is not limited to being made of a metal material, and may be made of various materials having rigidity. The housing 110 includes an upper part 111, a lower part 112, a first side part 113, and a second side part 114.

The upper part 111, the lower part 112, the first side part 113 and the second side part 114 are formed in a plate shape. The lower part 112 is disposed in parallel with the upper part 111. The first side part 113 connects the upper part 111 and the lower part 112. The second side part 114 is disposed in parallel with the first side part 113 and connects the upper part 111 and the lower part 112. In this case, the housing 110 is formed to have a first opening 100a that opens forward, that is, in the x-axis direction. In addition, air outside the housing 110 is introduced into the housing 110 through the first opening 100a. In addition, the housing 110 is formed to have a second opening 100b that opens backward on the opposite side of the first opening 100a.

As shown in FIG. 4, the transistor 120 is disposed below the upper part 111 inside the housing 110. The transistor 120 is an insulated gate bipolar transistor (IGBT), which is a semiconductor device capable of high-speed switching of high power. However, the transistor 120 is not limited to the insulated gate bipolar transistor, and may be various switching devices capable of switching power. Since the transistor 120 is a semiconductor device, the switching function may be deteriorated or damaged by heat generated from the transformer 160. Accordingly, the transistor 120 is disposed in a region of the housing 110 where heat generated from the transformer 160 is not transferred, and thus, a function of the transistor 120 is prevented from being deteriorated or damaged.

The heat sink 130 is disposed below the transistor 120 inside the housing 110. As shown in FIG. 6, the heat sink 130 provides a passage 133 through which air introduced from the outside of the housing 110 moves. The heat sink 130 is made of copper or aluminum. However, the material of the heat sink 130 is not limited to copper or aluminum, and may be made of various materials having thermal conductivity such as silver. The heat sink 130 receives heat generated from the transistor 120 and exchanges heat with air to dissipate heat from the transistor 120. Accordingly, the heat sink 130 prevents the transistor 120 from being damaged by heat.

The heat sink 130 includes a heat dissipation plate 131 supporting the transistor 120 and a plurality of heat dissipation fins 132 extending downward from the heat dissipation plate 131. The heat dissipation plate 131 is in contact with the transistor 120 to receive heat generated from the transistor 120. The plurality of heat dissipation fins 132 are disposed in parallel with the first side part 113. In this case, a passage 133 through which air introduced from the outside of the housing 110 moves is formed between the plurality of heat dissipation fins 132. In addition, the heat of the heat dissipation plate 131 is transferred to the plurality of heat dissipation fins 132, and the heat of the plurality of heat dissipation fins 132 is heat-exchanged with air. That is, the heat of the plurality of heat dissipation fins 132 is transferred to the air in the passage 133 and thus, the temperature of the air in the passage 133 is increased. Then, the air with increased temperature moves toward the transformer 160 along the passage 133.

The transistor 120 is disposed in parallel with the plurality of heat dissipation fins 132. Accordingly, the heat of the transistor 120 is uniformly transferred to each of the plurality of heat dissipation fins 132 through the heat dissipation plate 131, thereby preventing the heat dissipation performance from deteriorating due to the concentration of the heat of the heat dissipation plate 131 on a portion of the plurality of heat dissipation fins 132.

The first air blocking unit 141 is provided on a side surface of the heat sink 130 and is disposed in parallel with the first side part 113. The first air blocking unit 141 separates the heat sink 130 from the plurality of capacitors 150. Accordingly, heat generated from the plurality of capacitors 150 is prevented from being transferred to the heat sink 130, thereby improving the heat generation performance of the heat sink 130.

The plurality of capacitors 150 are disposed between the first air blocking unit 141 and the second side part 114. Air is introduced into the plurality of capacitors 150 through the first opening 100a of the housing 110. Also, the temperature of the air introduced into the plurality of capacitors 150 is increased by heat generated from the plurality of capacitors 150. The air having a temperature increased by the plurality of capacitors 150 is prevented from moving to the heat sink 130 by the first air blocking unit 141.

The transformer 160 is disposed to be spaced apart from the heat sink 130. The transformer 160 generates heat according to power conversion. In this case, the air of the heat sink 130 is moved to the transformer 160. The air of the transformer 160 is heat-exchanged with the transformer 160, and then is moved upward, that is, in the Z-axis direction. In addition, a discharge part 111a having a hole shape is formed in the upper part 111, and the air of the transformer 160 is discharged to the outside of the housing 110 through the discharge part 111a. That is, since the air whose temperature has been increased by the transformer 160 moves upward, the air of the transformer 160 does not flow back into the heat sink 130, and thus, the heat generated from the transformer 160 is not transferred to the transistor 120. In this way, heat generated from the transformer 160 is not transferred to the transistor 120, thereby preventing the performance of the power conversion apparatus 100 from deteriorating.

In addition, the power conversion apparatus 100 according to an embodiment of the present invention further includes a second air blocking unit 142 disposed between the plurality of capacitors 150 and the transformer 160.

The second air blocking unit 142 prevents air in the transformer 160 from moving to the plurality of capacitors 150 and also prevents heat of the transformer 160 from moving to the plurality of capacitors 150 in a radiation manner. Accordingly, the second air blocking unit 142 blocks the flow of heat between the transformer 160 and the plurality of capacitors 150, so that the performance of the plurality of capacitors 150 is prevented from being deteriorated by the heat of the transformer 160.

In addition, the power conversion apparatus 100 according to an embodiment of the present invention further includes a substrate 171, a bus bar 172, and a coupling part 173.

The substrate 171 is electrically connected to each of the transistor 120 and the plurality of capacitors 150. The bus bar 172 is electrically connected to the substrate 171 and the power device of the uninterruptible power supply 10 (see FIG. 1). One end of the bus bar 172 is electrically connected to the substrate 171, and the other end of the bus bar 172 protrudes toward the rear of the housing 110 through the second opening 100b. The coupling part 173 is coupled to the other end of the bus bar 172. The coupling part 173 is detachably coupled to a connector electrically connected to the power device of the uninterruptible power supply 10 (see FIG. 1). In this way, the transistor 120 and the plurality of capacitors 150 are electrically connected to the power device of the uninterruptible power supply 10 (see FIG. 1) through the substrate 171, the bus bar 172, and the coupling part 173.

FIG. 7 is a diagram schematically illustrating air flow in a power conversion apparatus according to an embodiment of the present invention.

The flow of air inside the housing 110 of the power conversion apparatus 100 according to the embodiment of the present invention will be described with reference to FIG. 7.

First, air outside the housing 110 is introduced into the heat sink 130 through the first opening 100a. The heat of the transistor 120 is transferred to the heat sink 130, and the heat of the heat sink 130 is heat-exchanged with air. The air introduced into the heat sink 130 moves in a first direction ① toward the transformer 160 from the first opening 100a.

The power conversion apparatus 100 according to an embodiment of the present invention further includes a support plate 115 disposed between the lower part 112 and the heat sink 130.

The support plate 115 supports the heat sink 130. In addition, the support plate 115 includes an air guide 115a formed to be inclined on one side of the support plate 115. The air guide 115a guides the air introduced from the outside of the housing 110 to be supplied below one side of the heat sink 130. Accordingly, even if a vortex of air is generated at one side of the heat sink 130, the air is guided to be supplied below the heat sink 130 by the air guide 115a, so that the air is smoothly supplied to the heat sink 130.

In addition, the air moved to the transformer 160 receives heat generated from the transformer 160. That is, the temperature of the air moved to the transformer 160 is increased by the transformer 160 and moved in a second direction (②), which is an upward direction. Accordingly, the air moving in the second direction (②) provides a driving force so that the air of the heat sink 130 moves in the first direction (②). That is, since the air moving in the second direction (②) does not move to the heat sink 130, the heat of the transformer 160 is not transferred to the transistor 120, thereby preventing the performance of the power conversion apparatus 100 from deteriorating.

In addition, the inside of the housing 110 is divided into a first area (A) where the transistor 120 and the heat sink 130 are disposed while air moves in the first direction (①), and a second area (B) where the transformer 160 is disposed while air moves in the second direction (②). In addition, the heat of the transformer 160 is prevented from being transferred to the transistor 120 by the flow of air moving in the first direction (①) and the second direction (②), while the first area (A) and the second area (B) are not blocked by a separate configuration. Thus, even if a discharge passage through which the heat of the transistor 120 is discharged and a discharge passage through which the heat of the transformer 160 are discharged are not separately installed, the transistor 120, the heat sink 130, and the transformer 160 are respectively disposed in the first area (A) and the second area (B) to control a single air flow, thereby securing heat generation efficiency of the power conversion apparatus 100 while preventing the power conversion apparatus 100 from increasing in size due to a separate heat dissipation structure.

FIG. 8 is a diagram showing a state before a power conversion apparatus according to an embodiment of the present invention is connected to an uninterruptible power supply, and FIG. 9 is a diagram illustrating a state in which a power conversion apparatus according to an embodiment of the present invention is connected to an uninterruptible power supply.

A method of connecting the power conversion apparatus 100 according to an embodiment of the present invention to the uninterruptible power supply 10 will be described with reference to FIGS. 1, 8 and 9.

The power conversion apparatus 100 is inserted into the case 11. The uninterruptible power supply 10 is provided with a connection part 14 connected to the power device of the power conversion apparatus 100. The connection part 14 is vertically disposed along the inner surface of the case 11. In addition, the connection part 14 includes a connector 15 protruding toward the front of the case 11. The coupling part 173 is detachably coupled to the connector 15. Specifically, the coupling part 173 is formed such that the connector 15 is inserted into the coupling part 173. That is, the connector 15 is inserted into and coupled to the coupling part 173. Accordingly, the power conversion apparatus 100 is electrically connected to the uninterruptible power supply 10. Conversely, when the power conversion apparatus 100 is separated from the case 11, the connector 15 is separated from the coupling part 173.

As described above, in the power conversion apparatus 100 according to an embodiment of the present invention, since the coupling part 173 is detachably coupled to the connector 15, there is no need for a process to combine the power conversion apparatus 100 with a separate bus bar, thereby improving the convenience of assembling or disassembling the power conversion apparatus 100 for maintenance.

Although an embodiment of the present invention have been described, the spirit of the present invention is not limited to the embodiment presented in the subject specification; and those skilled in the art who understands the spirit of the present invention will be able to easily suggest other embodiments through addition, changes, elimination, and the like of elements without departing from the scope of the same spirit, and such other embodiments will also fall within the scope of the present invention.

The invention claimed is:

1. A power conversion apparatus including:
a housing comprising an upper part, a lower part disposed in parallel with the upper part, a first side part connecting the upper part and the lower part, and a second side part disposed in parallel with the first side part;
a transistor provided below the upper part inside the housing;
a heat sink provided below the transistor and providing a passage through which air introduced from the outside moves;
a first air blocking unit provided on a side surface of the heat sink and disposed in parallel with the first side part;
a plurality of capacitors disposed between the first air blocking unit and the second side part; and
a transformer disposed to be spaced apart from the heat sink,

wherein the upper part is provided with a discharge part formed above the transformer such that air that has passed through the passage is discharged to the outside of the housing.

2. The power conversion apparatus according to claim 1, further including a second air blocking unit disposed between the plurality of capacitors and the transformer.

3. The power conversion apparatus according to claim 1, wherein the first air blocking unit is disposed between the heat sink and the capacitor.

4. The power conversion apparatus according to claim 1, wherein the heat sink includes:

a heat dissipation plate supporting the transistor; and a plurality of heat dissipation fins extending downward from the plate and spaced apart from each other in parallel with the first side part.

5. The power conversion apparatus according to claim 4, wherein the transistors is disposed in parallel with the plurality of heat dissipation fins.

6. The power conversion apparatus according to claim 4, further including a support plate disposed between the lower part and the heat sink and supporting the heat sink, wherein the support plate includes an air guide formed to be inclined on one side of the support plate, wherein the air guide guides air introduced from the outside to be supplied below one side of the heat sink.

7. The power conversion apparatus according to claim 1, further including:

a substrate electrically connected to the transistor and the plurality of capacitors;

a bus bar having one end electrically connected to the substrate and the other end protruding to the rear of the housing; and a coupling part coupled to the other end of the bus bar and detachably coupled to the connector of the uninterruptible power supply.

\* \* \* \* \*